United States Patent [19]

Buchwalter et al.

[11] Patent Number: 5,759,285
[45] Date of Patent: Jun. 2, 1998

[54] METHOD AND SOLUTION FOR CLEANING SOLDER CONNECTIONS OF ELECTRONIC COMPONENTS

[75] Inventors: Stephen L. Buchwalter, Hopewell Junction; Anson J. Call, Poughkeepsie, both of N.Y.

[73] Assignee: International Business Machines Corporation, Armonk, N.Y.

[21] Appl. No.: 699,750

[22] Filed: Aug. 20, 1996

[51] Int. Cl.⁶ .................. C23G 1/02; C23G 5/02
[52] U.S. Cl. .................. 134/3; 134/6; 134/34; 134/40; 134/41; 510/175
[58] Field of Search .................. 134/1, 1.3, 2, 3, 134/5, 6, 18, 34, 40, 41; 326/1; 510/174, 175

[56] References Cited

U.S. PATENT DOCUMENTS

| | | | |
|---|---|---|---|
| 3,401,126 | 9/1968 | Miller et al. | 252/514 |
| 4,270,933 | 6/1981 | Meny et al. | 55/279 |
| 5,081,563 | 1/1992 | Feng et al. | 361/414 |
| 5,512,613 | 4/1996 | Afzali-Ardakani et al. | 523/443 |
| 5,612,303 | 3/1997 | Takayanagi et al. | 510/174 |

*Primary Examiner*—Ardin H. Marschel
*Attorney, Agent, or Firm*—DeLio & Peterson, LLC; John J. Tomaszewski; Aziz M. Ahsan

[57] ABSTRACT

A composition for cleaning solder to remove flux, flux reaction products, residues, including residues from manufacturing operations such as plating and photoresist residues and other contaminants, without any significant dissolution of the solder especially solder used in fabricating electronic components such as C4 area array flip chip connectors, is provided. The composition comprises a non-aromatic sulfonic acid and a substituted alcohol with a preferred composition comprising 3 weight % methanesulfonic acid and 97 weight % trifluoroethanol. A method for cleaning solder and solder containing components made using the cleaning method and composition of the invention are also disclosed.

6 Claims, No Drawings

METHOD AND SOLUTION FOR CLEANING SOLDER CONNECTIONS OF ELECTRONIC COMPONENTS

BACKGROUND OF THE INVENTION

1. Field of the Invention

This invention relates generally to the use of solder to electrically connect one electronic component to another electronic component and, in particular, to providing a solution for cleaning the solder during the electronic component manufacturing process to prevent corrosion of the connections and early failure of the component.

2. Description of Related Art

Forming an electronic package such as an electrical component where an integrated circuit chip is electrically connected to a substrate such as a ceramic module, a circuit card, a board, or any other electronic part is well-known in the art.

For attachment to ceramic modules, an important technology particularly for high-end computers is flip-chip attach or controlled collapse chip connection (C4) in which arrays of solder balls are fabricated on the I/O pads of the chips and used to connect the chip to the ceramic module. To make the electrical connection the solder balls are positioned with flux on the corresponding pads on the ceramic module and passed through a furnace to reflow the solder and allow it to wet the pads on both the chip and the ceramic.

Surface mount technology (SMT) using solder connections has gained acceptance as the preferred means of joining electronic devices together, particularly at the circuit card level. As compared to more traditional pin connection methods, where a pin mounted to the backside of a ceramic module is thrust through a hole in the board, twice the number of modules can be placed on the same board area using SMT.

For convenience, the following description will be directed to flip-chip and surface mount solder connectors but it will be appreciated by those skilled in the art that the invention is applicable to the cleaning of solder used in other forms in the fabrication of electronic components as well as other articles made using solder, e.g., hermetic sealing.

A myriad of solder structures have been proposed for the interconnection of one electronic structure to another. Typical surface mount processes form the solder structures by screening solder paste on conductive, generally metallic pads exposed on the surface of a first electronic structure or substrate. A stencil printing operation is used to align the contact mask to the pads. The solder paste areas on the screened substrate are then aligned to corresponding pads on the electronic structure or board to be connected thereto. After alignment, the substrate and board go through a reflow operation to melt the solder paste and create a solder bond between the corresponding pads on the substrate and board.

Other known interconnect technologies use solder balls rather than a solder paste to provide the solder connecting structures. By using plated or evaporated solder balls, a more exact and somewhat greater quantity of solder can be applied than through screening. The solder balls are aligned and are held to a substrate and melted to form a solder joint on a conductive pad of the substrate. The use of solder ball connectors has been applied to the mounting of integrated circuit chips using the so-called C4 (control collapse chip connection) technology since the method and structure were first described and patented in U.S. Pat. Nos. 3,401,126 and 3,429,042 of Miller, which patents are assigned to the present assignee. More recently, larger solder balls have been used in surface mount technology to attach single or multichip packages to circuit cards in so-called ball grid array or BGA technology.

Regardless of the form of the solder connection or the method of making the solder connection, there are typically three stages at which cleaning of the solder surface may be essential. First, during deployment of the solder prior to making the connections, processing of solder may leave undesirable residues. For example, in evaporating or plating of solder balls for flip-chip (C4) connection or BGA module, photoresist or plating bath residues may be left which will interfere with proper solder wetting of the pads. Second, to maintain the alignment of the solder to the pads on the substrate or card and to allow good wetting of the solder on the pads, flux is most often used and will need to be removed to avoid leaving corrosive contaminants on the packaging assembly. Finally, rework of part-good assemblies requires special handling which may require a cleaning step that assures the reliability of the package. For example, removal of a reworkable epoxy underfill, as described in U.S. Pat. No. 5,512,613 which is assigned to the present assignee, requires a cleaning process which does not attack the C4 solder joints.

Unfortunately, however, removal of the flux and flux products and cleaning of the solder is a difficult task because the cleaning process may itself be corrosive to the solder and/or electronic component. Additionally, dissolution of the solder can occur resulting in a smaller amount of solder forming the solder bond and cause disposal problems since the solders are generally lead/tin alloys and their solutions pose an environmental threat if discharged.

Bearing in mind the problems and deficiencies of the prior art, it is therefore an object of the present invention to provide a composition useful for cleaning solder to remove residual flux, flux products and other contaminants from the solder without causing any significant metal dissolution.

It is a further object of the invention to provide a composition for cleaning solder used in the manufacture of electronic components such as C4 solder connectors.

It is another object of the present invention to provide a method for cleaning solder, especially solder used in the fabrication of electronic components, and components made using the method.

Other objects and advantages of the present invention will be readily apparent from the following description.

SUMMARY OF THE INVENTION

The above and other objects, which will be apparent to those skilled in the art, are achieved in the present invention which is directed in the first aspect to a composition for cleaning solder to remove flux, flux reaction products, contaminants, residues from manufacturing operations, e.g., plating bath and photoresist residues and the like without any significant dissolution of the solder comprising a solution of a non-aromatic sulfonic acid and a substituted alcohol preferably a substituted aliphatic alcohol. The non-aromatic organic sulfonic acid is preferably methanesulfonic acid (MSA) and the alcohol 2,2,2-trifluoroethanol.

In a second aspect of the invention, a method is provided for cleaning solder using the above composition by applying the composition to the solder to be cleaned in any suitable way, e.g., by immersion in a bath at a temperature of about 25° to 75° C., or higher, preferably 50° to 70° C. for 1 to 120 minutes, preferably 5 to 60 minutes. Immersion may be performed under an inert cover (e.g., $N_2$) but this is not necessary using the composition of the invention.

DESCRIPTION OF THE PREFERRED EMBODIMENTS

The present cleaning composition and method of the invention can be used to clean solder and for providing cleaned solder joints on substrates connecting a substrate to another component utilizing any solder bonding technology. In the packaging area, there are a plethora of electronic structures which require connection to other similar electronic structures or to other levels of packaging. For example, integrated circuit chips might be mounted to a metallized ceramic substrate, a card on which several integrated chips had been surface mounted may be subsequently surface mounted to a board which provides interconnection circuitry to a main frame computer and the like. For the sake of clarity and consistency, the cleaning solution and method of cleaning solder of the present invention will be described for a multilayer ceramic substrate having a chip attached thereto by C4 technology.

The solder used is a low melting alloy used in numerous joining applications in microelectronics and may vary widely as in well-known in the art. The solder is typically a lead/tin alloy such as, by weight, 40Pb/60 Sn alloy and may contain up to 97% Pb or above, e.g., 97% Pb/3% Sn. A typical solder used in commercial C4 applications contains, by weight, 97% lead and 3% tin.

Fluxes used may also vary widely and are typically rosin based. A flux may be generally defined as a material that chemically attacks surface oxides so that molten solder can wet the surface to be soldered. During the soldering process, the solder is melted and reflowed to form the connection and residual flux, flux reaction products and contaminants and residues resulting from, for example, products resulting from the reaction of the flux with the solder form and must be removed.

Thus, after chip attachment, the solder must be cleaned to remove residual flux, flux products and other contaminants. This is typically performed as exemplified by a C4 manufacturing process by immersion in a bath containing an organic solvent such as xylene.

Using the composition and method of the invention, the composition is applied to the solder as described above at a temperature of about 25° to 75° C., preferably 50° to 70° C. for 1 to 120 minutes, preferably 5 to 60 minutes.

The composition of the invention comprises a non-aromatic sulfonic acid and a substituted alcohol, preferably an aliphatic alcohol. Broadly stated, the composition comprises, by weight, about 0.5 to 25% sulfonic acid, preferably 1 to 10% and most preferably 2 to 5%, and about 75 to 99.5% substituted alcohol, preferably 90 to 99% and most preferably 95 to 98%.

The non-aromatic sulfonic acid is preferably methanesulfonic acid because of its demonstrated effectiveness. Other non-aromatic aliphatic sulfonic acids include substituted and unsubstituted, ethanesulfonic acid, propanesulfonic acid, anhydrides and other derivatives thereof including methanesulfonic anhydride. Substituents include halides such as fluorine, e.g., trifluoromethanesulfonic acid.

The substituted alcohol is preferably 2,2,2-trifluoroethanol because of its demonstrated effectiveness. Other substituted alcohols include other halosubstituted alcohols such as 2,2,2-trichloroethanol.

Other components may be added to the cleaning solution as is known in the art for desired functions such as wetting or foam retardation.

The invention will now be described by the following examples which are not intended to be limiting.

EXAMPLE I

A cleaning solution was prepared by dissolving 6.4 grams of 99+% pure methanesulfonic acid in 200 ml of 2,2,2-trifluoroethanol. The solution was heated to 70° C. and a chip bearing an array of more than 700 C4 solder balls of composition 97% lead 3% tin was immersed in the solution for 90 minutes using a magnetic stirring bar for mixing. Weighing the chip before and after the treatment on a microanalytical balance showed that there was no measurable weight loss. Examination of the chip and its solder balls under a microscope showed no evidence of deposits of any kind and the solder balls were clean and commercially acceptable.

EXAMPLE II

Example 1 was repeated except that the container holding the solution was left open to the atmosphere. Again no measurable weight loss was detected.

Example III

Example I was repeated except the amount of methanesulfonic acid used in the solution was doubled to 12.8 grams. Again no measurable weight loss was detected.

EXAMPLE IV

A chip mounted on a ceramic module with C4 connections was subjected to the solution of Example I under the same conditions, but with mechanical stirring for 60 minutes. Following the 60 minute exposure, the solution was drained out of the bottom of the container; and the module was immediately rinsed at least three times with deionized water. The module was then subjected to 1 week at 85C/85% relative humidity. Upon removal, no evidence of corrosion was observed.

COMPARATIVE EXAMPLES

EXAMPLE A

Example I was repeated with a solution of 6.4 grams p-toluenesulfonic acid hydrate in 200 ml 2,2,2-trifluoroethanol. The solder was attacked as evidenced by crystalline deposits between the C4 solder balls readily apparent under low power magnification.

EXAMPLE B

Example I was repeated with ethanol substituted for 2,2,2-trifluoroethanol. The solder was attacked as evidenced by a 0.9% weight loss.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method for cleaning solder comprising contacting the solder with a composition consisting essentially of a non-aromatic sulfonic acid and 2,2,2-trifluoroethanol or 2,2,2,-trichloroethanol.

2. The method of claim 1 wherein the acid is methane sulfonic acid and the alcohol is 2,2,2-trifluoroethanol 3. The method of claim 2 wherein the composition comprises, by 2 weight, about 0.5 to 25% methane sulfonic acid and 99.5 to 75% 2,2,2-trifluoroethanol.

4. The method of claim 3 wherein the methane sulfonic acid is 1 to 10% and the 2,2,2-trifluoroethanol is 90 to 99%.

5. The method of claim 1 used to clean solder joints of an electronic component.

6. The method of claim 4 used to clean solder joints of an electronic component.

* * * * *